United States Patent
Zhang

(10) Patent No.: US 9,024,425 B2
(45) Date of Patent: *May 5, 2015

(54) THREE-DIMENSIONAL MEMORY COMPRISING AN INTEGRATED INTERMEDIATE-CIRCUIT DIE

(71) Applicant: HangZhou HaiCun Information Technology Co., Ltd., HangZhou (CN)

(72) Inventor: Guobiao Zhang, Corvallis, OR (US)

(73) Assignees: HangZhou HaiCun Information Technology Co., Ltd., HangZhou, ZheJiang (CN); Guobiao Zhang, Corvallis, OR (US)

( * ) Notice: Subject to any disclaimer, the term of this patent is extended or adjusted under 35 U.S.C. 154(b) by 23 days.

This patent is subject to a terminal disclaimer.

(21) Appl. No.: 13/798,135

(22) Filed: Mar. 13, 2013

(65) Prior Publication Data

US 2013/0201743 A1 Aug. 8, 2013

Related U.S. Application Data

(63) Continuation-in-part of application No. 13/591,257, filed on Aug. 22, 2012, now Pat. No. 8,921,991.

(60) Provisional application No. 61/529,929, filed on Sep. 1, 2011.

(51) Int. Cl.
*H01L 23/02* (2006.01)
*G11C 5/02* (2006.01)
*H01L 27/06* (2006.01)
*H01L 25/065* (2006.01)

(Continued)

(52) U.S. Cl.
CPC .......... *G11C 5/02* (2013.01); *H01L 2224/32145* (2013.01); *H01L 2224/32225* (2013.01); *H01L 2224/48145* (2013.01); *H01L 2224/48227* (2013.01); *H01L 2224/73265* (2013.01); *H01L 27/0688* (2013.01); *H01L 27/101* (2013.01); *G11C 13/0004* (2013.01); *G11C 13/0007* (2013.01); *G11C 13/0011* (2013.01); *G11C 13/0038* (2013.01); *G11C 2213/71* (2013.01); *H01L 25/0657* (2013.01); *H01L 25/105* (2013.01); *H01L 25/18* (2013.01); *H01L 2225/1023* (2013.01); *H01L 2225/107* (2013.01); *H01L 2225/06506* (2013.01); *H01L 2225/06562* (2013.01)

(58) Field of Classification Search
CPC .......... H01L 2924/00014; H01L 2224/48091; H01L 2225/06562
USPC ................ 257/296, 303, 311, 314, 315, 686; 438/238, 241, 257, 258, 262, 264, 266
See application file for complete search history.

(56) References Cited

U.S. PATENT DOCUMENTS 4,404,655 A 9/1983 Naiff
4,424,579 A 1/1984 Roesner
(Continued)

*Primary Examiner* — Kyoung Lee
*Assistant Examiner* — Ratisha Mehta

(57) ABSTRACT

The present invention discloses a discrete three-dimensional memory (3D-M). It comprises at least a 3D-array die and at least an integrated intermediate-circuit die comprising both a read/write-voltage generator ($V_R/V_W$-generator) and an address/data translator (A/D-translator). The intermediate-circuit die performs voltage, address and/or data conversion between the 3D-M core region and the host. Discrete 3D-M support multiple 3D-array dies.

20 Claims, 8 Drawing Sheets

(51) Int. Cl.
*H01L 25/10* (2006.01)
*H01L 25/18* (2006.01)
*H01L 27/10* (2006.01)
*G11C 13/00* (2006.01)

(56) References Cited

U.S. PATENT DOCUMENTS

| | | |
|---|---|---|
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,385,074 B1 | 5/2002 | Johnson et al. |
| 6,515,888 B2 | 2/2003 | Johnson et al. |
| 6,587,387 B1 | 7/2003 | Fan et al. |
| 6,731,011 B2 | 5/2004 | Verma et al. |
| 6,773,937 B1 | 8/2004 | Ho et al. |
| 7,149,119 B2 | 12/2006 | Fasoli |
| 7,219,271 B2 | 5/2007 | Kleveland et al. |
| 7,383,476 B2 | 6/2008 | Crowley et al. |
| 7,675,802 B2 | 3/2010 | Kagan et al. |
| 7,696,812 B2 | 4/2010 | Al-Shamma et al. |
| 7,892,865 B2 | 2/2011 | Yano et al. |
| 7,952,904 B2 | 5/2011 | Zhang |
| 8,000,121 B2 | 8/2011 | Norman |
| 8,000,134 B2 | 8/2011 | Cornwell et al. |
| 8,141,021 B2 | 3/2012 | Norman |
| 8,208,297 B2 | 6/2012 | Norman |
| 8,223,525 B2 | 7/2012 | Balakrishnan et al. |
| 2001/0055822 A1* | 12/2001 | Kato et al. .............. 438/3 |
| 2005/0177679 A1* | 8/2005 | Alva et al. .............. 711/104 |
| 2007/0263439 A1 | 11/2007 | Cornwell et al. |
| 2008/0130342 A1* | 6/2008 | Zhang .............. 365/51 |
| 2008/0159722 A1* | 7/2008 | Zhang .............. 386/124 |
| 2010/0142289 A1* | 6/2010 | Oku .............. 365/189.09 |
| 2010/0174854 A1* | 7/2010 | Kim .............. 711/103 |
| 2010/0208503 A1* | 8/2010 | Kuo .............. 365/51 |
| 2011/0246857 A1* | 10/2011 | Bae et al. .............. 714/763 |

* cited by examiner

THREE-DIMENSIONAL MEMORY COMPRISING AN INTEGRATED INTERMEDIATE-CIRCUIT DIE

CROSS-REFERENCE TO RELATED APPLICATIONS

This is a continuation-in-part of application, "Discrete Three-Dimensional Memory", application Ser. No. 13/591,257, filed Aug. 22, 2012, which relates to a provisional application, "Three-Dimensional Memory with Separate Memory-Array and Peripheral-Circuit Substrates", Application Ser. No. 61/529,929, filed Sep. 1, 2011.

BACKGROUND

1. Technical Field of the Invention

The present invention relates to the field of integrated circuit, and more particularly to three-dimensional memory (3D-M).

2. Prior Arts

Three-dimensional memory (3D-M) is a monolithic semiconductor memory comprising a plurality of vertically stacked memory levels. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). Depending on its programming mechanism, 3D-M can comprise a memristor memory, a resistive random-access memory (RRAM or ReRAM), a phase-change memory (PCM), a programmable metallization memory (PMM), or a conductive-bridging random-access memory (CBRAM).

U.S. Pat. No. 5,835,396 issued to Zhang on Nov. 3, 1998 discloses a 3D-M, more particularly a 3D-ROM. As illustrated in FIG. 1A, a 3D-M die 20 comprises a substrate level OK and a plurality of vertically stacked memory levels 16A, 16B. The substrate level OK comprises transistors Ot and interconnects Oi. Transistors Ot are formed in a semiconductor substrate O, while interconnects Oi, including substrate metal layers OM1, OM2, are formed above the substrate O but below the lowest memory level 16A. The memory levels (e.g. 16A) are coupled to the substrate O through contact vias (e.g. 1av).

Each of the memory levels (e.g. 16A) comprises a plurality of upper address lines (e.g. 2a), lower address lines (e.g. 1a) and memory cells (e.g. 5aa). The memory cells could comprise diodes, transistors or other devices. Among all types of memory cells, the diode-based memory cells are of particular importance because they have the smallest size of ~4F$^2$, where F is the minimum feature size. Since they are generally formed at the cross points between the upper and lower address lines, the diode-based memory cells form a cross-point array. Hereinafter, diode is broadly interpreted as any two-terminal device whose resistance at the read voltage is substantially lower than when the applied voltage has a magnitude smaller than or polarity opposite to that of the read voltage. In one exemplary embodiment, diode is a semiconductor diode, e.g. p-i-n silicon diode. In another exemplary embodiment, diode is a metal-oxide diode, e.g. titanium-oxide diode, nickel-oxide diode.

The memory levels 16A, 16B form at least a 3D-M array 16, while the substrate level OK comprises the peripheral circuits for the 3D-M array 16. A first portion of the peripheral circuits are located underneath the 3D-M array 16 and referred to as under-array peripheral circuit. A second portion of the peripheral circuits are located outside the 3D-M array 16 and referred to as outside-array peripheral circuits 18. Because the space 17 above the outside-array peripheral circuits 18 does not contain any memory cells, this space is actually wasted.

U.S. Pat. No. 7,383,476 issued to Crowley et al. on Jun. 3, 2008 discloses an integrated 3D-M die 20. It can directly use the power supply 23 from a host and exchange address/data 27 with the host. Here, a host is an apparatus that directly uses the 3D-M, and the address/data 27 used by the host are logical address/data.

As illustrated in FIG. 1B, the integrated 3D-M die 20 comprises a 3D-M core region 22 and an intermediate-circuit region 28. The 3D-M core region 22 comprises a plurality of 3D-M arrays (e.g. 22aa, 22ay) and their decoders (e.g. 24, 24G). These decoders include local decoders 24 and global decoders 24G. The local decoder 24 decodes address/data for a single 3D-M array, while the global decoder 24G decodes global address/data 25 to each 3D-M array. Here, the address/data 25 of the 3D-M core region 22 are physical address/data.

The intermediate-circuit region 28 comprises the intermediate circuits between the 3D-M core region 22 and the host. The intermediate circuit 28 performs voltage, address and/or data conversion between the 3D-M core region 22 and the host. For example, it converts power supply 23 to read voltage $V_R$ and/or write (programming) voltage $V_W$; it also converts the logic address/data 27 to the physical address/data 25 and vice versa. The intermediate circuit 28 comprises a read/write-voltage generator ($V_R/V_W$-generator) 21 and an address/data translator (A/D-translator) 29. The $V_R/V_W$-generator 21 includes a band gap reference generator (precision reference generator) 21B, a $V_R$ generator 21R and a charge pump 21W (referring to U.S. Pat. No. 6,486,728, "Multi-Stage Charge Pump", issued to Kleveland on Nov. 26, 2002). The A/D-translator 29 includes an error checking & correction (ECC) circuit 29E, a page register/fault memory 29P and a smart write controller 29W. The ECC circuit 29E detects and corrects data after they are read out from the 3D-M array(s) (referring to U.S. Pat. No. 6,591,394, "Three-Dimensional Memory Array and Method for Storing Data Bits and ECC Bits Therein" issued to Lee et al. on Jul. 8, 2003). The page register/fault memory 29P serves as an intermediate storage device with respect to the host and the 3D-M array(s). It also performs ECC-encoding (referring to U.S. Pat. No. 8,223,525, "Page Register Outside Array and Sense Amplifier Interface", issued to Balakrishnan et al. on Jul. 17, 2012). The smart write controller 29W monitors write-error. Once a write-error occurs, it activates the self-repair mechanism to reprogram data to a redundant row (referring to U.S. Pat. No. 7,219,271, "Memory Device and Method for Redundancy/Self-Repair", issued to Kleveland et al. on May 15, 2007). The prior-art integrated 3D-M die 20 performs voltage, address and data conversion internally.

Generally speaking, the intermediate circuits 28 are outside-array peripheral circuits 18. Because they occupy a large area on the 3D-M die 20, the prior-art integrated 3D-M die 20 has low array efficiency. Here, the array efficiency is defined as the ratio between the total memory area (i.e. the chip area used to store user data) and the total chip area. In 3D-M, the total memory area ($A_M$) is the chip area directly underneath user-addressable bits (i.e. not counting bits a user cannot access) and can be expressed as $A_M = A_c * C_L = (4F^2) * C_{3D-M}/N$, where $A_c$ is the area of a single memory cell, $C_L$ is the storage capacity per memory level, F is the address-line pitch, $C_{3D-M}$ is the total storage capacity of the 3D-M and N is the total number of memory levels in the 3D-M. In the following paragraphs, two 3D-M dies are examined for their array efficiencies.

As a first example, a 3-D one-time-programmable memory (3D-OTP) is disclosed in Crowley et al. "512 Mb PROM with 8 Layers of Antifuse/Diode Cells" (referring to 2003 International Solid-State Circuits Conference, FIG. 16.4.5). This 3D-OTP die has a storage capacity of 512 Mb and comprises eight memory levels manufactured at 0.25 um node. The total memory area is $4*(0.25 \text{ um})^2*512 \text{ Mb}/8 = 16 \text{ mm}^2$. With a total chip area of 48.3 $mm^2$, the array efficiency of the 3D-OTP die is ~33%.

As a second example, a 3-D resistive random-access memory (3D-ReRAM) is disclosed in Liu et al. "A 130.7 $mm^2$ 2-Layer 32 Gb ReRAM Memory Device in 24 nm Technology" (referring to 2013 International Solid-State Circuits Conference, FIG. 12.1.7). This 3D-ReRAM die has a storage capacity of 32 Gb and comprises two memory levels manufactured at 24 nm node. The total memory area is $4*(24 \text{ nm})^2*32 \text{ Gb}/2 = 36.8 \text{ mm}^2$. With a total chip area of 130.7 $mm^2$, the array efficiency of the 3D-ReRAM die is ~28%.

In the prior-art integrated 3D-M die 20, its 3D-M arrays are integrated with all of its intermediate-circuit components (including $V_R/V_W$-generator and A/D-translator). The integrated 3D-M is thought to be advantageous based on the prevailing belief that integration lowers cost. Unfortunately, this belief is no longer true for a 3D-M. Because the 3D-M arrays use a complex back-end process while their intermediate circuits use a relatively simple back-end process, integrating the 3D-M arrays with their intermediate circuits will force the intermediate circuits to use the expensive manufacturing process for the 3D-M arrays. As a result, integration does not lower the overall cost of the 3D-M, but actually increases it. To make things worse, because they can only use the same number of metal layers (e.g. as few as two) as the 3D-M arrays, the intermediate circuits are difficult to design and occupy a large chip area. Finally, because the 3D-M cells generally require high-temperature processing, the intermediate circuits need to use high-temperature interconnect materials, e.g. tungsten (W). This degrades the 3D-M performance.

OBJECTS AND ADVANTAGES

It is a principle object of the present invention to provide a three-dimensional memory (3D-M) with a lower cost.

It is a further object of the present invention to improve the 3D-M performance.

It is a further object of the present invention to improve the array efficiency of a 3D-M die.

In accordance with these and other objects of the present invention, a discrete 3D-M is disclosed. The design guideline behind the discrete 3D-M is to separate three-dimensional (3-D) circuit and two-dimensional (2-D) circuit onto different dies so that they can be independently optimized. To improve array efficiency, manipulation on power supply, address and data on a 3D-array die should be minimized.

SUMMARY OF THE INVENTION

The present invention discloses a discrete three-dimensional memory (3D-M). It comprises at least a 3D-array die (a 3-D circuit) and at least an integrated intermediate-circuit die (a 2-D circuit) comprising both a read/write-voltage generator ($V_R/V_W$-generator) and an address/data translator (A/D-translator). The 3D-array die is formed in a 3-D space and comprises a plurality of functional (memory) levels. The intermediate-circuit die is formed on a 2-D plane and comprises a single functional (analog and digital) level. The 3-D and 2-D circuits are separated onto different dies so that they can be optimized independently. Apparently, integrating $V_R/V_W$-generator and A/D-translator onto a single intermediate-circuit die lowers the packaging cost for the intermediate-circuit die while keeping the array efficiency of the 3D-array die high. Because the 3D-array die comprises neither $V_R/V_W$-generator nor A/D-translator, the array efficiency of the 3D-array die could easily exceed 40%, even reach ~60%. Discrete 3D-M supports multiple 3D-array dies and can be used for high-capacity 3D-M-based memory card and 3D-M-based solid-state drive.

Because it is manufactured using an independent process with less complex back-end, the wafer cost of the intermediate-circuit die is much less than the 3D-array die. As a result, the discrete 3D-M is less expensive than the integrated 3D-M for a given storage capacity. In addition, being a separate die and not constrained by the 3D-array die, the intermediate-circuit die can comprise more metal layers (e.g. four vs. two). Hence, its $V_R/V_W$-generator and A/D-translator are easier to design and occupy less chip area. Furthermore, because the intermediate-circuit die does not require high-temperature processing, its interconnects may use high-speed interconnect materials, e.g. copper (Cu). This can improve the 3D-M performance.

Figure 1A:
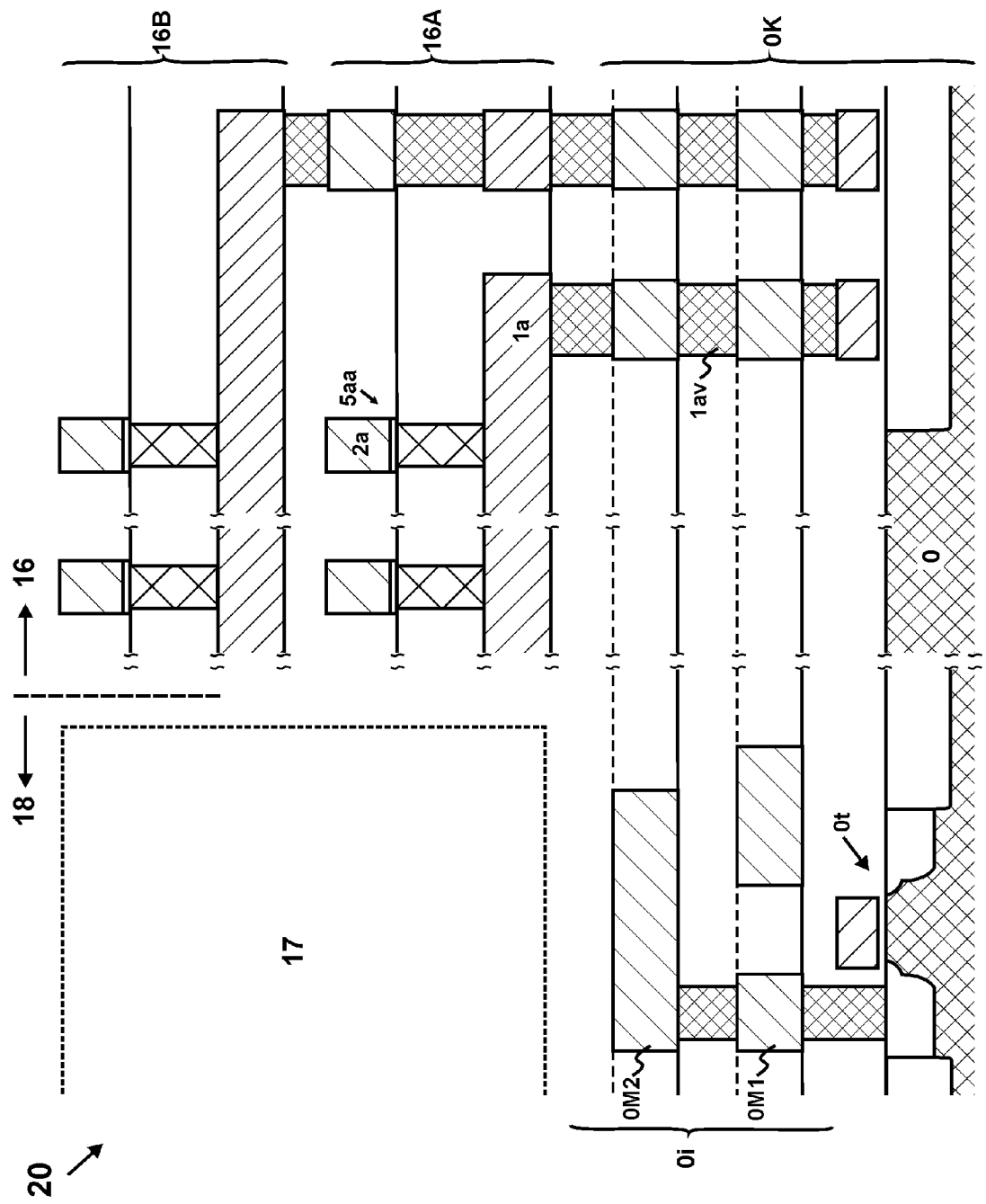
FIG. 1A is a cross-sectional view of a prior-art three-dimensional memory (3D-M)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In the present invention, the symbol "/" means a relationship of "and" or "or". For example, the read/write-voltage generator ($V_R/V_W$-generator) could generate either only the read voltage, or only the write voltage, or both the read voltage and the write voltage; the address/data translator (A/D-translator) could translate either only address, or only data, or both address and data.

In the present invention, the intermediate circuit is the circuit between the 3D-M core region and the host. It performs voltage, address and/or data conversion between the host and the 3D-M core region. For example, it can convert external voltage (i.e. voltage supply $V_{DD}$), external address (i.e. logical address) and external data (i.e. logical data) of the host to the internal voltage (i.e. read voltage $V_R$, write voltage $V_W$), internal address (i.e. physical address) and internal data (i.e. physical data) of the 3D-M core region. The intermediate-circuit components include $V_R/V_W$-generator and A/D-translator.

Figure 2A:
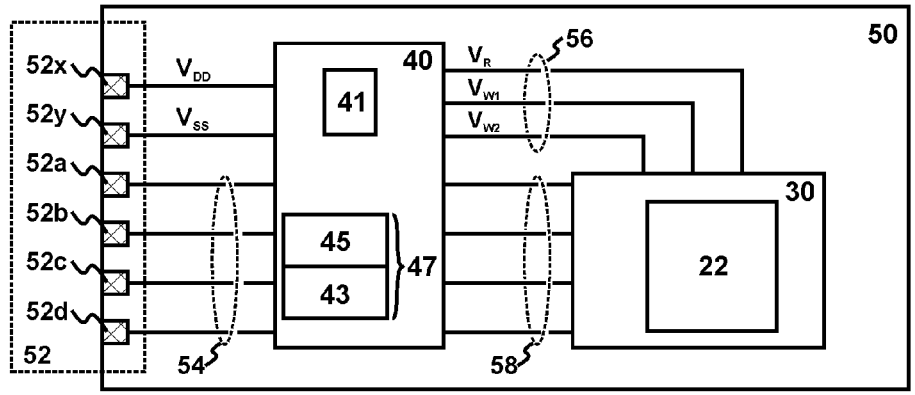
FIGS. 2A-2C are circuit block diagrams of three preferred discrete 3D-M's comprising an integrated intermediate-circuit die.
Figure 2B:
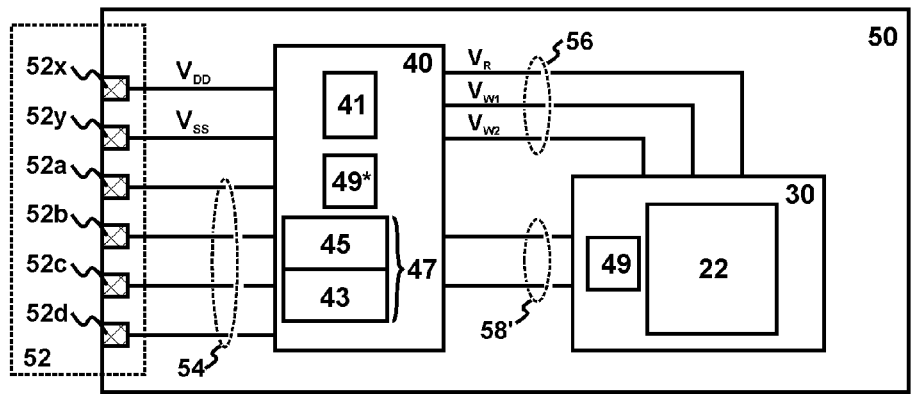
Figure 2C:
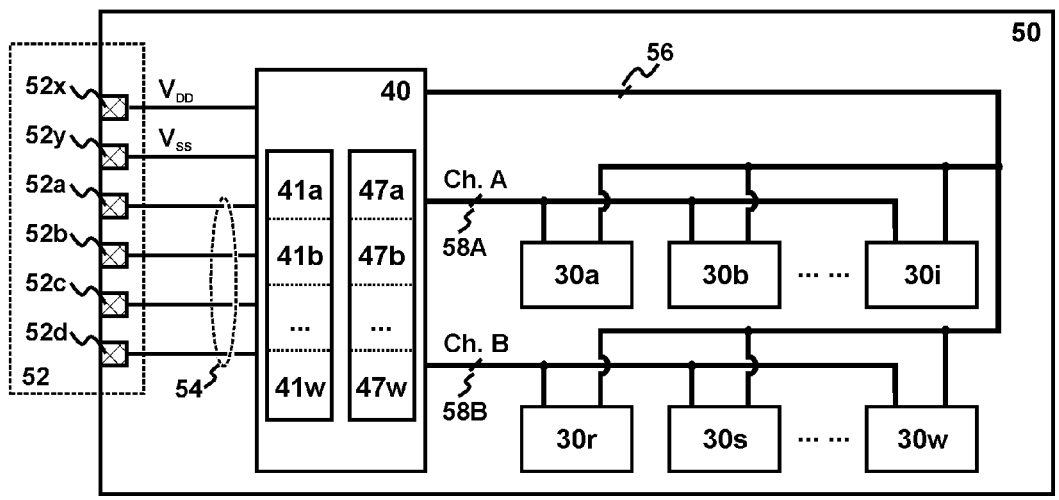

Referring now to FIGS. 2A-2C, three preferred discrete three-dimensional memory (3D-M) 50 comprising an integrated intermediate-circuit die are disclosed. Each of these preferred embodiments comprises at least a 3D-array die (a 3-D circuit) and at least an integrated intermediate-circuit die (a 2-D circuit) comprising both a $V_R/V_W$-generator and an A/D-translator. The 3D-array die is formed in a 3-D space and comprises a plurality of functional (memory) levels. The intermediate-circuit die is formed on a 2-D plane and comprises a single functional (analog and digital) level. The 3-D and 2-D circuits are separated onto different dies so that they can be optimized independently. Apparently, integrating $V_R/V_W$-generator and A/D-translator onto a single intermediate-circuit die lowers the packaging cost for the intermediate-circuit die while keeping the array efficiency of the 3D-array die high.

The discrete 3D-M 50 includes an interface 52 for physically connecting to and electrically communicating with a variety of hosts. The interface 52 includes contacts 52x, 52y, 52a-52d which are coupled to corresponding contacts in a host receptacle. For example, the host provides a voltage supply $V_{DD}$ and a ground voltage $V_{SS}$ to the discrete 3D-M 50 through the power contact 52x and the ground contact 52y, respectively; the host further exchanges address/data with the discrete 3D-M 50 through signal contacts 52a-52b. Because they are directly used by the host, these address/data are logical address/data.

Figure 1B:
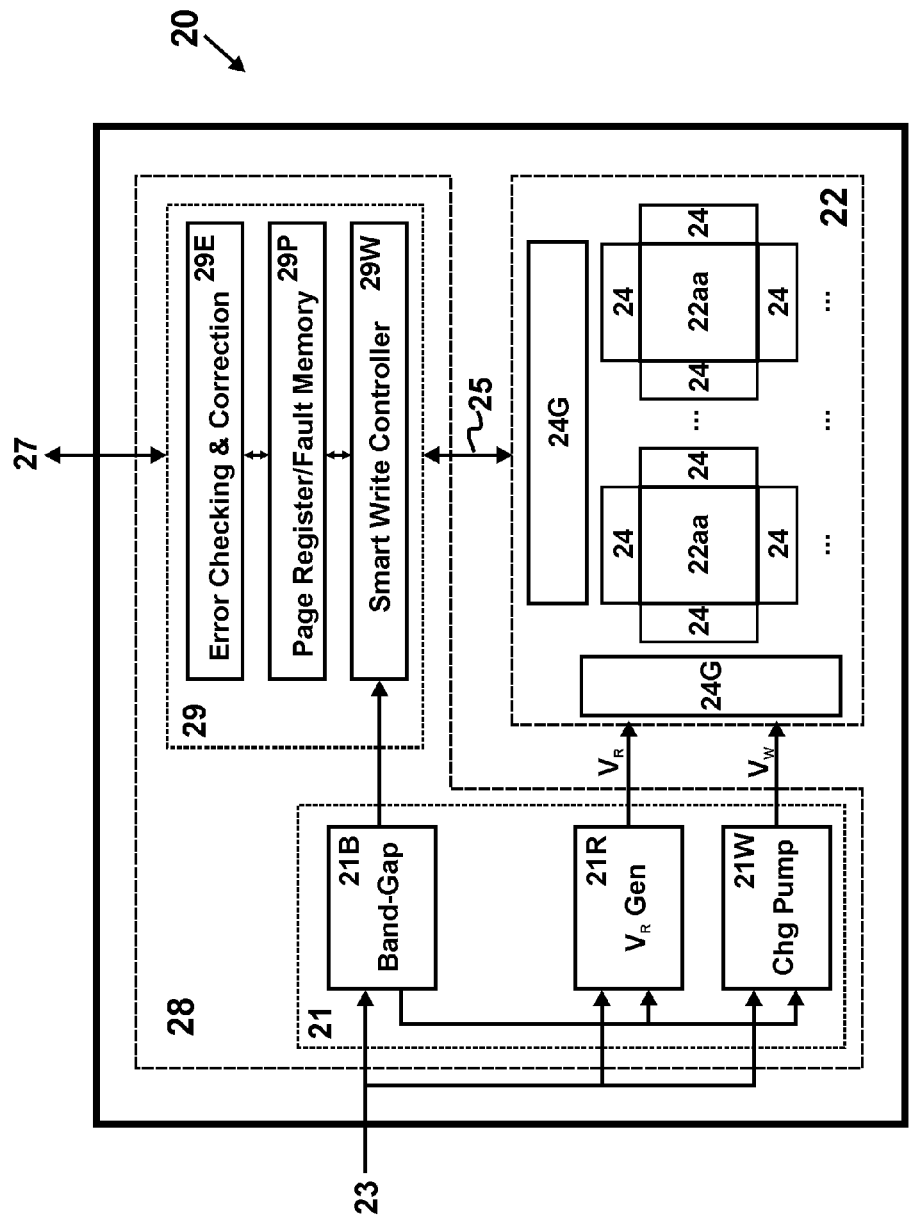
FIG. 1B shows a system architecture of a prior-art integrated 3D-M die.

The preferred discrete 3D-M 50 in FIG. 2A is a 3D-M-based memory card. It comprises a separate 3D-array die (a 3-D circuit) 30 and a separate intermediate-circuit die (a 2-D circuit) 40. The 3D-array die 30 comprises a 3D-M core region 22 (as FIG. 1B), which comprises a plurality of 3D-M arrays (e.g. 22aa . . . ) and their decoders (e.g. 24, 24G). The intermediate-circuit die 40 comprises both a $V_R/V_W$-generator 41 and an A/D-translator 47. In other words, the $V_R/V_W$-generator 41 and A/D-translator 47 are integrated onto a same intermediate-circuit die 40. Because the 3D-array die 30 comprises neither $V_R/V_W$-generator 41 nor A/D-translator 47, its array efficiency can easily exceed 40%, even reach ~60%.

The $V_R/V_W$-generator 41 receives a voltage supply $V_{DD}$ from the host, converts it into read/write voltages and provides them to the 3D-array die 30 through a power bus 56. Here, the read/write voltages could be either a read voltage $V_R$, or a write voltage $V_W$, or both read voltage $V_R$ and write voltage $V_W$. They could have different values from the voltage supply $V_{DD}$. In this preferred embodiment, the read/write voltage includes one read voltage $V_R$ and two write voltages $V_{W1}$, $V_{W2}$. Alternatively, it could include more than one read voltage or more than two write voltages.

The A/D-translator 47 comprises an address translator 43 and a data translator 45. The address translator 43 converts logical address represented on the external bus 54 (including signals from contacts 52a-52d) to physical address represented on an internal bus 58 and vice versa; the data translator 45 converts logical data represented on the external bus 54 to physical data represented on an internal bus 58 and vice versa. Here, A/D-translator 47 can convert address only, or convert data only, or convert both address and data.

Because it is manufactured using an independent process with less complex back-end, the wafer cost of the intermediate-circuit die is much less than the 3D-array die. As a simple estimate, suppose the wafer cost of the intermediate-circuit die 40 is about half of the 3D-array die 30 and the array efficiency increases from 30% of the integrated 3D-M die 20 to 40% of the 3D-array die 30, the overall cost of the discrete 3D-M 50 is ~88% of the integrated 3D-M 20 for a given storage capacity; if the array efficiency further increases to 60%, the overall cost of the discrete 3D-M 50 becomes only ~75% of the integrated 3D-M 20.

The preferred discrete 3D-M 50 in FIG. 2B is also a 3D-M-based memory card. Different from FIG. 2A, the 3D-array die 30 further comprises a first serializer-deserializer (SerDes) 49. It converts parallel digital signals (e.g. address/data/command/status) inside the 3D-array die 30 to serial digital signals 58' outside the 3D-array die 30 and vice versa. The intermediate-circuit die 40 further comprise a second serializer-deserializer 49*. It converts parallel digital signals (e.g. address/data/command/status) inside the intermediate-circuit die 40 to serial digital signals 58' outside the intermediate-circuit die 40 and vice versa. By serializing digital signals, the number of connections 58' (e.g. bond wires, solder bumps) between the 3D-array die 30 and the intermediate-circuit die 40 of FIG. 2B becomes less than that of FIG. 2A. This helps to reduce the packaging cost.

The preferred discrete 3D-M 50 in FIG. 2C is a high-capacity 3D-M-based memory card or a 3D-M-based solid-state drive. It comprises an intermediate-circuit die 40 and a plurality of 3D-array dies 30a, 30b . . . 30w. The intermediate-circuit die 40 comprises a plurality of $V_R/V_W$-generators 41a, 41b . . . 41w and A/D-translators 47a, 47b . . . 47w. Each $V_R/V_W$-generator (e.g. 41a) provides read/write voltages to a corresponding 3D-array die (e.g. 30a); and each A/D-translator (e.g. 47a) performs address/data conversion for a corresponding 3D-array die (e.g. 30a). The 3D-array dies 30a, 30b . . . 30w form two channels: Channel A and Channel B. For Channel A, the internal bus 58A from the intermediate-circuit die 40 provides physical address/data to the 3D-array dies 30a, 30b . . . 30i; for Channel B, the internal bus 58B from the intermediate-circuit die 40 provides physical address/data to the 3D-array dies 30r, 30s . . . 30w. In the meantime, the power bus 56 from the intermediate-circuit die 40 provides read/write-voltages to all 3D-array dies 30a, 30b . . . 30w. Although two channels are used in this example, it should be apparent to those skilled in the art that more than two channels may be used in a high-capacity 3D-M-based memory card or a 3D-M-based solid-state drive.

Figure 3A:
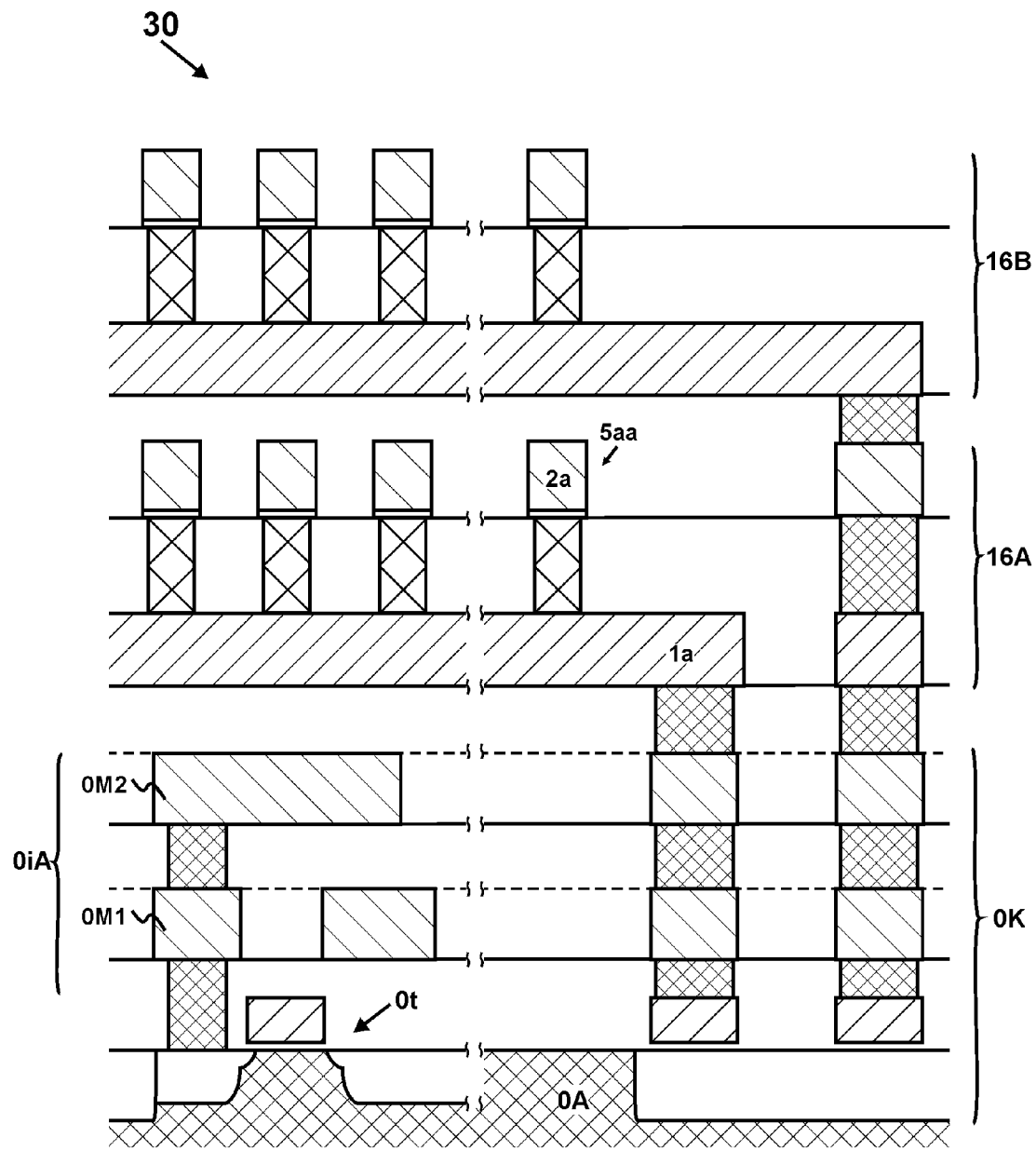
FIG. 3A is a cross-sectional view of a preferred 3D-array die.
Figure 3B:
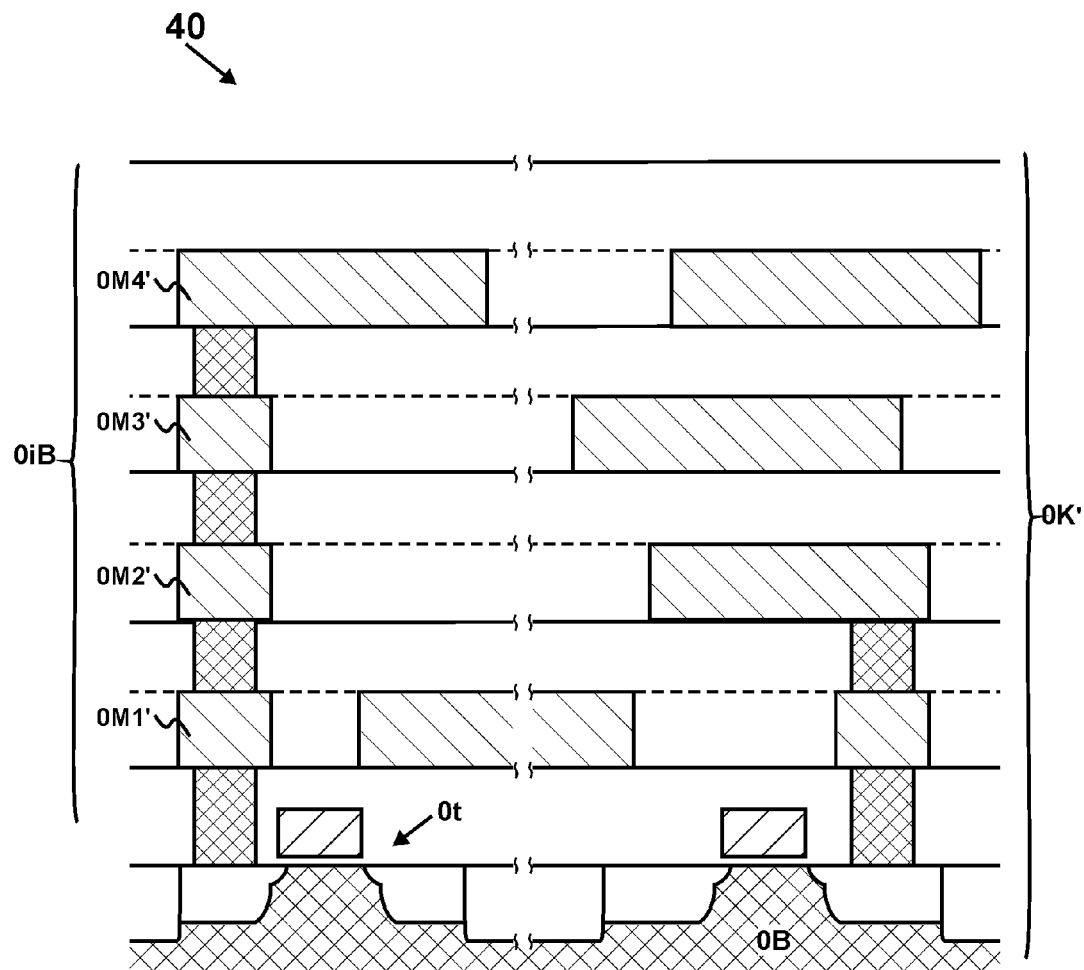
FIG. 3B is a cross-sectional view of a preferred intermediate-circuit die.

Referring now to FIGS. 3A-3B, cross-sectional views of the preferred 3D-array die 30 and intermediate-circuit die 40 are illustrated. As illustrated in FIG. 3A, the preferred 3D-array die 30 is formed in a 3-D space and comprises multiple functional levels, i.e. substrate level 0K and memory levels 16A, 16B. The substrate level 0K comprises transistors 0t and interconnects 0iA. Transistors 0t are formed in a 3D-array substrate 0A. Interconnects 0iA include two substrate metal layers 0M1, 0M2. To accommodate the high-temperature process for the memory cells (e.g. 5aa), the substrate metal layers 0M1, 0M2 preferably comprise high-temperature interconnect materials, e.g. tungsten (W). The memory levels 16A, 16B are similar to those of the 3D-M 20 of FIG. 1A.

In FIG. 3B, the preferred intermediate-circuit die 40 is formed on a 2-D plane and comprises a single functional level, i.e. the substrate level OK'. The substrate level OK' comprises transistors Ot and interconnects OiB. Transistors are formed on an intermediate-circuit substrate OB. Interconnects OiB include four metal layers OM1'-OM4'. Because the 3D-array die 30 and the intermediate-circuit die 40 are separate dies, the intermediate-circuit die 40 can be manufactured using an independent and less expensive process, not the expensive process for the 3D-array die 30. As a result, the wafer cost of the intermediate-circuit die 40 is significantly less than that of the 3D-array die 30.

Being a separate die, the intermediate-circuit die 40 can comprise more metal layers (four vs. two) than the integrated 3D-M die 20. Accordingly, its $V_R/V_W$-generator and A/D-translator are easier to design and occupy less chip area. Furthermore, because the intermediate-circuit die 40 does not require high-temperature processing, its interconnects OiB may use high-speed interconnect materials, e.g. copper (Cu). This can improve the performance of the intermediate-circuit die 40, as well as the performance of the 3D-M.

Figure 4A:
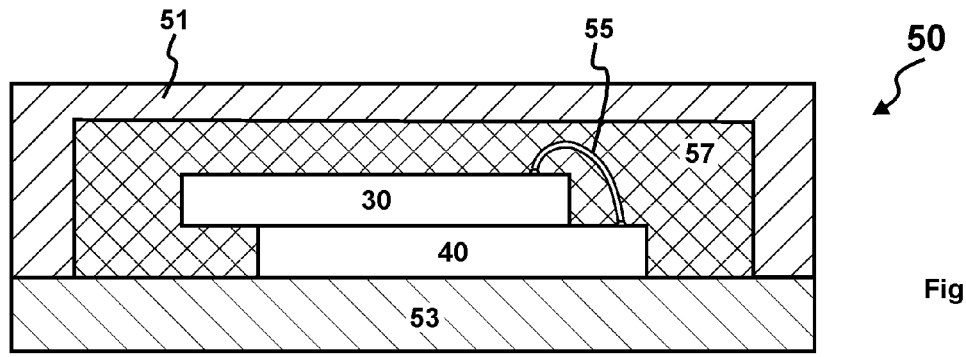
FIGS. 4A-4C are cross-sectional views of three preferred discrete 3D-M.
Figure 4B:
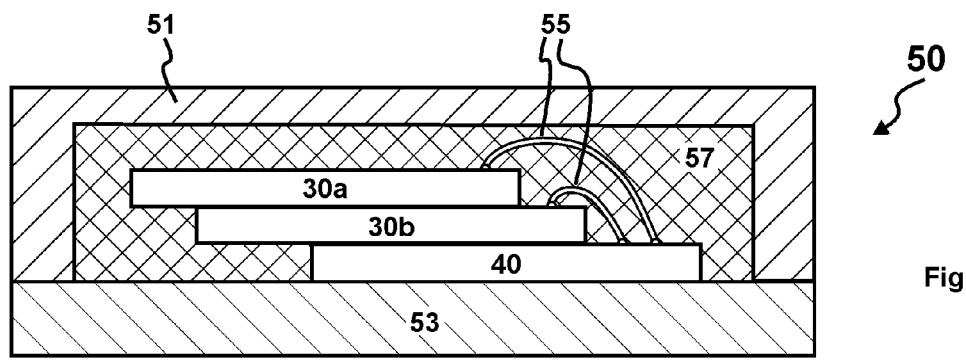
Figure 4C:
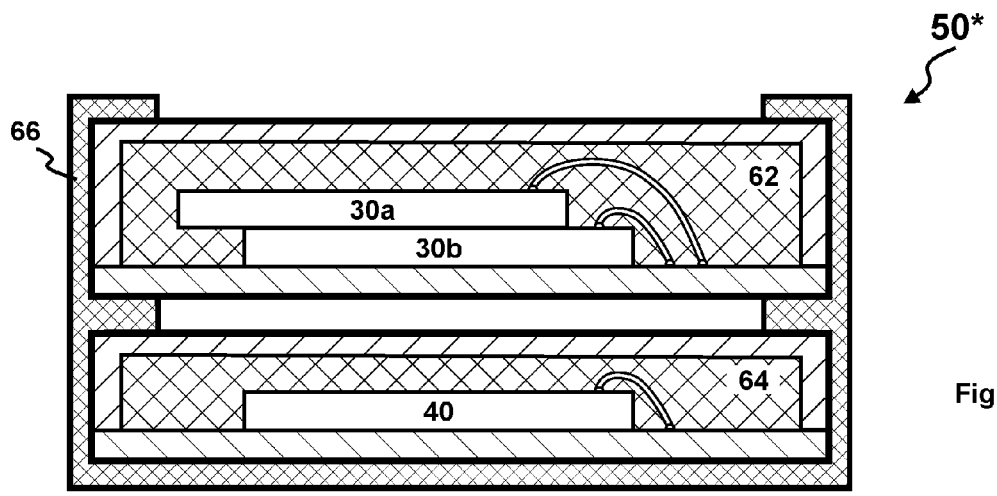

Referring now to FIG. 4A-4C, three preferred discrete 3D-M's 50 are disclosed. The preferred embodiments in FIGS. 4A-4B are multi-chip packages (MCP). The preferred MCP 50 of FIG. 4A comprises two separate dies: a 3D-array die 30 and an intermediate-circuit die 40. These dies 30, 40 are vertically stacked on a package substrate 53 and located inside a package housing 51. Bond wires 55 provide electrical connection between the dies 30 and 40. Alternatively, solder bumps may be used. To ensure data security, the dies 30, 40 are preferably encapsulated into a molding compound 57. In this preferred embodiment, the 3D-array die 30 is vertically stacked above the intermediate-circuit die 40. Alternatively, the intermediate-circuit die 40 can be stacked above the 3D-array die, or the 3D-array die 30 can be stacked face-to-face towards the intermediate-circuit die 40, or the 3D-array die 30 can be mounted side-by-side with the intermediate-circuit die 40. This preferred 3D-M MCP 50 may use a circuit block diagram of FIGS. 2A-2B.

The preferred MCP 50 of FIG. 4B comprises two 3D-array dies 30a, 30b and an intermediate-circuit die 40. These dies 30a, 30b, 40 are three separate dies. They are located inside a package housing 51. The 3D-array die 30a is vertically stacked on the 3D-array die 30b, and the 3D-array die 30b is vertically stacked on the intermediate-circuit die 40. Bond wires 55 provide electrical connections between the dies 30a, 30b, and 40. This preferred 3D-M MCP 50 may use a circuit block diagram of FIG. 2C.

The discrete 3D-M of FIG. 4C is a multi-chip module (MCM) 50*. It comprises a module frame 66, which houses two discrete packages, i.e. a 3D-array package 62 and an intermediate-circuit package 64. The 3D-array package 62 compromises two 3D-array dies 30a, 30b, while the intermediate-circuit package 64 comprises an intermediate-circuit die 40. The module frame 66 provides electrical connections between the 3D-array package 62 and the intermediate-circuit package 64 (not drawn in this figure). This preferred 3D-M MCM 50* may use a circuit block diagram of FIG. 2C.

Figure 5A:
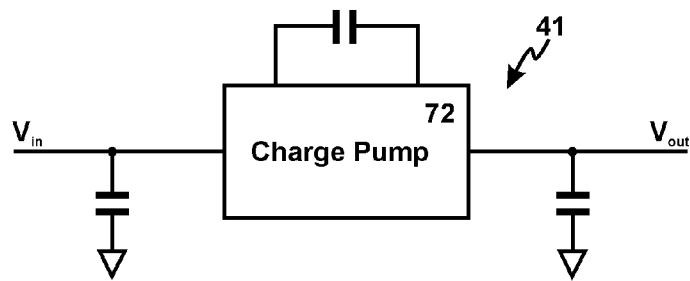
FIGS. 5A-5C are circuit diagrams of three preferred read/write-voltage generators ($V_R/V_W$-generator)
Figure 5B:
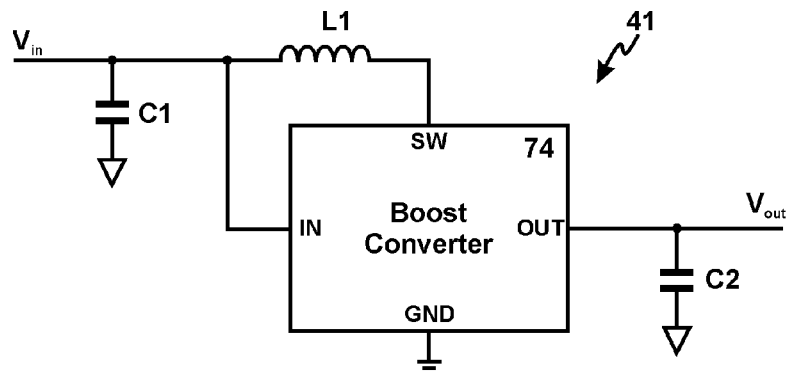
Figure 5C:
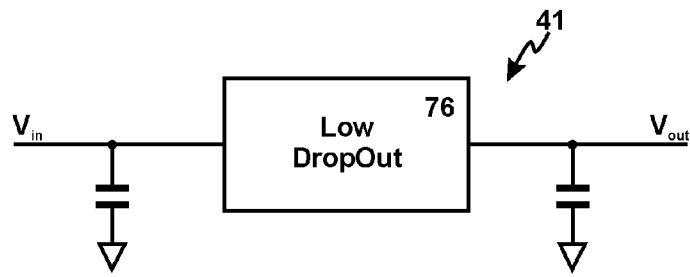

Referring now to FIGS. 5A-5C, three preferred $V_R/V_W$-generators 41 are disclosed. The $V_R/V_W$-generator 41 preferably uses a DC-to-DC converter. It could be a step-up, whose output voltage is higher than the input voltage, or a step-down, whose output voltage is lower than the input voltage. Examples of step-up include charge pump (FIG. 5A) and boost converter (FIG. 5B), and examples of step-down include low dropout (FIG. 5C) and buck converter.

In FIG. 5A, the $V_R/V_W$-generator 41 includes a charge pump 72 whose output voltage $V_{out}$ is higher than input voltage $V_{in}$. Generally, a charge pump 72 includes one or more capacitors. In FIG. 5B, the $V_R/V_W$-generator 41 is a high frequency boost converter 74 whose output voltage $V_{out}$ is higher than input voltage $V_{in}$. It may be formed with a low profile inductor so that the profile of the $V_R/V_W$-generator 41 is within the limits for a memory card or a solid-state drive. In FIG. 5C, the $V_R/V_W$-generator 41 includes a low dropout (LDO) 76 whose output voltage $V_{out}$ is lower than input voltage $V_{in}$. Generally, an LDO 76 uses one or more capacitors.

Figure 6A:
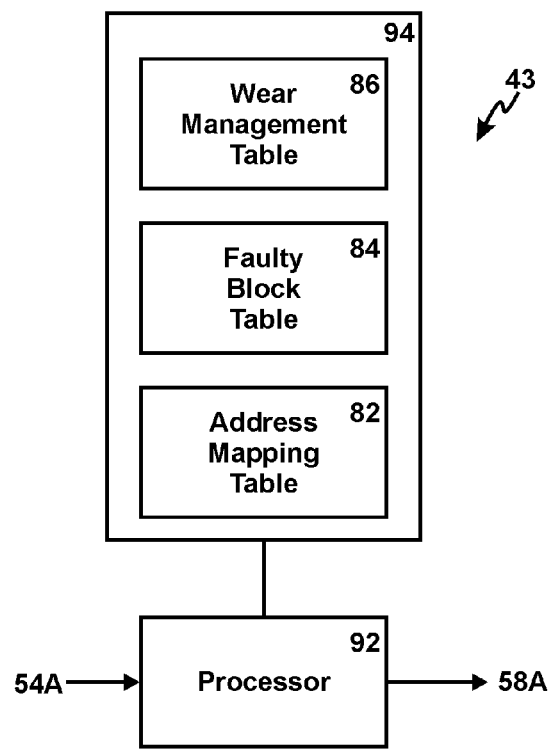
FIGS. 6A-6B are block diagrams of two preferred address/data translators (A/D-translator).
Figure 6B:
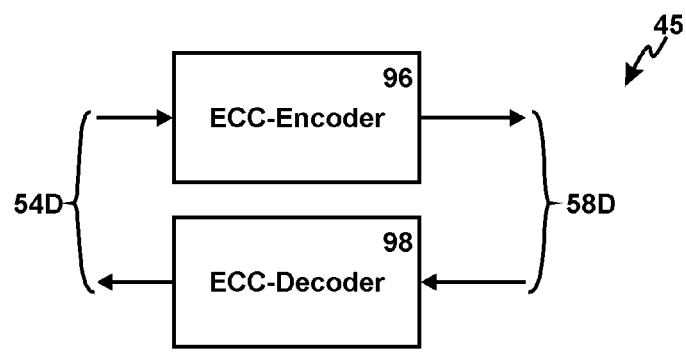

Referring now to FIGS. 6A-6B, components of an A/D-translator 47, i.e. address translator 43 and data translator 45, are disclosed. FIG. 6A discloses a preferred address translator 43. It converts the logical address 54A it receives from the host to the physical address 58A of a 3D-array die 30. The address translator 43 comprises a processor 92 and a memory 94. The memory 94 stores at least an address mapping table 82, a faulty block table 84 and a wear management table 86. These tables 82, 84, 86 are permanently stored in a read-only memory (ROM), which could a non-volatile memory (NVM) such as flash memory. During operation, these tables 82, 84, 86 are loaded into a random-access memory (RAM) for faster access. When a single A/D-translator 47 supports multiple 3D-array dies (e.g. 30a, 30b . . . 30w, as shown in FIGS. 2G-2H), the memory 94 stores tables 82, 84, 86 for all 3D-array dies 30a, 30b . . . 30w and therefore, is shared by all 3D-array dies 30a, 30b . . . 30w.

Among tables 82, 84, 86 stored in the memory 94, the address mapping table 82 maintains links between the logical address and the physical address; the faulty block table 84 records the addresses of the faulty blocks in the 3D-M array(s); and the wear management table 88 keeps a log of the number of read/write performed to each block. As used herein, the term "block" refers to an allocation unit of memory and can be any size ranging from a single memory cell to all of the memory cells in a 3D-M array.

During read, upon receiving the logical address 54A for the memory block to be read, the processor 94 looks up the address mapping table 82 and fetches the physical address 58A corresponding to the logical address 54A. During write, upon receiving the logical address 54A for the memory block to be written, the processor 94 looks up the address mapping table 82, the faulty block table 84 and the wear management table 88 to choose an unoccupied, good and less-used block to write data. The address of the chosen block is its physical address 58A.

FIG. 6B discloses a preferred data translator 45. It converts the logical data it receives from the host to the physical data of a 3D-array die, or converts the physical data of a 3D-array die to the logical data it outputs to the host. The data translator 45 comprises an ECC-encoder 96 and an ECC-decoder 98. The ECC-encoder 96 encodes the input logical data 54D to the physical data 58D, which are to be stored in the 3D-M array. The ECC-decoder 98 decodes the physical data 58D retrieved from the 3D-M array to the output logical data 54D. During this process, the error bits in the physical data 58D are detected and corrected. The ECC coding algorithms suitable for the 3D-M include Reed-Solomon coding, Golay coding, BCH coding, Multi-dimensional parity coding, Hamming coding and others.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional memory (3D-M), comprising:
   a 3D-array die comprising at least a 3D-M array including a plurality of vertically stacked memory levels;
   an intermediate-circuit die comprising at least a first portion of a read/write-voltage generator and at least a second portion of an address/data translator, wherein said read/write-voltage generator provides said 3D-array die with at least a read voltage and/or a write voltage other than the voltage supply, and said address/data translator converts at least an address and/or data between a host and said 3D-array die;
   wherein said first portion of said read/write-voltage generator and said second portion of said address/data translator are absent from said 3D-array die; said 3D-array die comprises more back-end layers than said intermediate-circuit die; and, said 3D-array die and said intermediate-circuit die are separate dice.

2. The discrete 3D-M according to claim 1, wherein said read/write-voltage generator comprises a DC-to-DC converter.

3. The discrete 3D-M according to claim 1, wherein said address/data translator is an address translator comprising at least one of an address mapping table, a faulty block table and a wear management table.

4. The discrete 3D-M according to claim 1, wherein said address/data translator is a data translator comprising at least one of an ECC-encoder and an ECC-decoder.

5. The discrete 3D-M according to claim 1, wherein said 3D-M comprises a three-dimensional read-only memory (3D-ROM) or a three-dimensional random-access memory (3D-RAM).

6. The discrete 3D-M according to claim 5, wherein said 3D-ROM is a three-dimensional mask-programmed read-only memory (3D-MPROM), or a three-dimensional electrically-programmable read-only memory (3D-EPROM).

7. The discrete 3D-M according to claim 1, wherein said 3D-M comprises at least one of a memristor, a resistive random-access memory (RRAM or ReRAM), a phase-change memory (PCM), a programmable metallization cell (PMC), and a conductive-bridging random-access memory (CBRAM).

8. The discrete 3D-M according to claim 1, wherein at least one of said 3D-array die and said intermediate-circuit die further comprises a parallel-serial converting means.

9. The discrete 3D-M according to claim 1, wherein said 3D-array die and said intermediate-circuit die are located in a memory package, a memory module, a memory card or a solid-state drive.

10. The discrete 3D-M according to claim 1, further comprising another 3D-array die including at least another 3D-M array, wherein said intermediate-circuit die further comprises at least a third portion of another read/write-voltage generator and at least a fourth portion of another address/data translator for said another 3D-array die.

11. A discrete three-dimensional memory (3D-M), comprising:
    a 3D-array die comprising at least a 3D-M array including a plurality of vertically stacked memory levels;
    an intermediate-circuit die comprising at least a first portion of a read/write-voltage generator and at least a second portion of an address/data translator, wherein said read/write-voltage generator provides said 3D-array die with at least a read voltage and/or a write voltage other than the voltage supply, and said address/data translator converts at least an address and/or data between a host and said 3D-array die;
    wherein said first portion of said read/write-voltage generator and said second portion of said address/data translator are absent from said 3D-array die; said intermediate-circuit die comprises at least one different interconnect material than said 3D-array die; and, said 3D-array die and said intermediate-circuit die are separate dice.

12. The discrete 3D-M according to claim 11, wherein the interconnect materials of said 3D-array die are stable at a higher processing temperature than the interconnect materials of said intermediate-circuit die.

13. The discrete 3D-M according to claim 11, wherein at least an interconnect material of said intermediate-circuit die has a higher electrical conductivity than at least another interconnect material of said 3D-array die.

14. The discrete 3D-M according to claim 11, wherein said 3D-M comprises a three-dimensional read-only memory (3D-ROM) or a three-dimensional random-access memory (3D-RAM).

15. The discrete 3D-M according to claim 11, wherein said 3D-array die and said intermediate-circuit die are located in a memory package, a memory module, a memory card or a solid-state drive.

16. The discrete 3D-M according to claim 11, further comprising another 3D-array die including at least another 3D-M array, wherein said intermediate-circuit die further comprises at least a third portion of another read/write-voltage generator and at least a fourth portion of another address/data translator for said another 3D-array die.

17. A discrete three-dimensional memory (3D-M), comprising:
    a 3D-array die comprising at least a 3D-M array including a plurality of vertically stacked memory levels;
    an intermediate-circuit die comprising at least a first portion of a read/write-voltage generator and at least a second portion of an address/data translator, wherein said read/write-voltage generator provides said 3D-array die with at least a read voltage and/or a write voltage other than the voltage supply, and said address/data translator converts at least an address and/or data between a host and said 3D-array die;
    wherein said first portion of said read/write-voltage generator and said second portion of said address/data translator are absent from said 3D-array die; said intermediate-circuit die comprises more substrate interconnect layers than said 3D-array die; and, said 3D-array die and said intermediate-circuit die are separate dice.

18. The discrete 3D-M according to claim 17, wherein said 3D-M comprises a three-dimensional read-only memory (3D-ROM) or a three-dimensional random-access memory (3D-RAM).

19. The discrete 3D-M according to claim 17, wherein said 3D-array die and said intermediate-circuit die are located in a memory package, a memory module, a memory card or a solid-state drive.

20. The discrete 3D-M according to claim 17, further comprising another 3D-array die including at least another 3D-M array, wherein said intermediate-circuit die further comprises at least a third portion of another read/write-voltage generator and at least a fourth portion of another address/data translator for said another 3D-array die.

* * * * *